(12) United States Patent
Babcock et al.

(10) Patent No.: US 7,598,575 B1
(45) Date of Patent: Oct. 6, 2009

(54) SEMICONDUCTOR DIE WITH REDUCED RF ATTENUATION

(75) Inventors: Jeffrey A. Babcock, Sunnyvale, CA (US); Yongseon Koh, Palo Alto, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 42 days.

(21) Appl. No.: 11/900,467

(22) Filed: Sep. 12, 2007

(51) Int. Cl.
*H01L 27/088* (2006.01)

(52) U.S. Cl. .............. 257/408; 257/229; 257/279; 257/296; 257/301; 257/324; 257/355; 257/359; 257/407; 257/E21.548

(58) Field of Classification Search .......... 257/279, 257/407
See application file for complete search history.

(56) References Cited

U.S. PATENT DOCUMENTS

| | | | | |
|---|---|---|---|---|
| 5,789,286 | A * | 8/1998 | Subbanna | 438/221 |
| 5,859,450 | A * | 1/1999 | Clark et al. | 257/233 |
| 6,232,161 | B1 | 5/2001 | Chen et al. | 438/199 |
| 6,621,679 | B1 | 9/2003 | Segervall | |
| 6,621,680 | B1 | 9/2003 | Segervall | |
| 2002/0005543 | A1 * | 1/2002 | Di Pede et al. | 257/314 |

OTHER PUBLICATIONS

C. Patrick Yue and S. Simon Wong, "A Study on Substrate Effects of Silicon-Based RF Passive Components", International Microwave Symposium Digest, Jun. 1999, pp. 1625-1628.
C. Patrick Yue and S. Simon Wong, "Design Strategy of On-Chip Inductors for Highly Integrated RF Systems", Design Automation Conference Proceedings, Jun. 1999, pp. 982-987.
C. Patrick Yue and S. Simon Wong, "On-Chip Spiral Inductors with Patterned Ground Shields for Si-Based RF IC's", IEEE Journal of Solid-State Circuits, vol. 33, No. 5, May 1998, pp. 743-752.

* cited by examiner

*Primary Examiner*—N Drew Richards
*Assistant Examiner*—Kyoung Lee
(74) *Attorney, Agent, or Firm*—Mark C. Pickering (57) ABSTRACT

The attenuation of an RF signal on a metal trace in a semiconductor die is substantially reduced by utilizing a number of RF blocking structures that lie on the surface of the substrate directly below the metal trace that carries the RF signal. The RF blocking structures include an isolation ring, and one or more doped regions that are formed inside the isolation ring.

22 Claims, 12 Drawing Sheets

SEMICONDUCTOR DIE WITH REDUCED RF ATTENUATION

BACKGROUND OF THE INVENTION

1. Field of the Invention

The present invention relates to a semiconductor die and, more particularly, to a semiconductor die with reduced RF attenuation.

2. Description of the Related Art

A semiconductor die is a well-known structure that includes a substrate material, such as single-crystal silicon, a metal interconnect structure that sits on top of the substrate material, and a number of electronic devices that are formed in and on the substrate material and/or in the metal interconnect structure. The metal interconnect structure electrically connects the electronic devices together to realize an electronic circuit.

Figure 1:
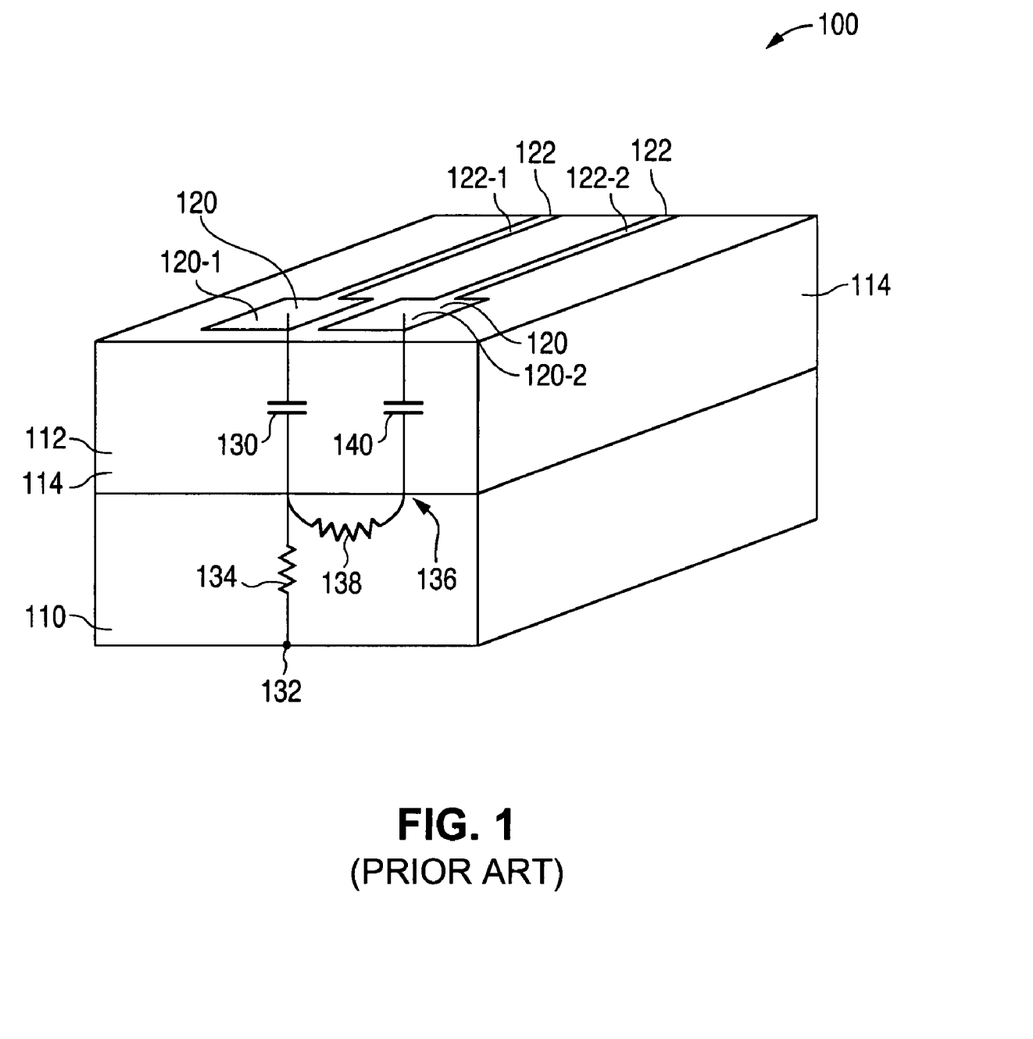
FIG. 1 is a perspective view illustrating an example of a prior-art semiconductor die 100.

FIG. 1 shows a perspective view that illustrates an example of a prior-art semiconductor die 100. As shown in FIG. 1, semiconductor die 100 includes a substrate material 110, and a metal interconnect structure 112 that sits on substrate material 110. Metal interconnect structure 112, in turn, includes a non-conductive material 114, and a number of layers of metal, including a top layer of metal, that are isolated by non-conductive material 114.

In the FIG. 1 example, only the top layer of metal is shown. In this example, the top layer of metal has a number of metal bond pads 120, including metal bond pad 120-1 and metal bond pad 120-2, and a number of metal traces 122, including metal trace 120-1 and metal trace 120-2, that extend away from the metal bond pads 120. Each metal bond pad 120 provides a point for an external electrical connection, while each metal trace 122 provides a signal path. Although not shown, the metal traces 122 are electrically connected to the electronic devices that are formed in and on substrate 110 material and/or in the metal interconnect structure 112.

In operation, when an RF signal is applied to metal bond pad 120-1, the RF signal propagates down metal trace 122-1. The RF signal on metal bond pad 120-1 and metal trace 122-1, in turn, is undesirably capacitively coupled to substrate material 110. In other words, as shown in FIG. 1, metal bond pad 120-1 and metal trace 122-1 function as the top plate of a parasitic capacitor 130, substrate material 110 functions as the bottom plate of parasitic capacitor 130, and non-conductive region 114 functions as the dielectric layer of parasitic capacitor 130.

Substrate material 110, in turn, is electrically conductive. As a result, as shown in FIG. 1, the RF signal capacitively coupled to substrate material 110 is also resistively coupled to a substrate bias node 132, such as ground, by a resistance 134. Thus, since a capacitor functions as a short circuit to a time varying signal, the RF signal is effectively connected to ground by way of resistance 134. As a result, a parasitic signal path exists from metal bond pad 120-1 and metal trace 120-1 to ground by way of capacitor 130 and resistance 134 that can significantly attenuate the RF signal propagating down metal trace 120-1.

In addition, the RF signal capacitively coupled to substrate material 110 is also resistively coupled to a region 136 of substrate 110 by a resistance 138. In region 136, the RF signal can be capacitively coupled to metal bond pad 120-2 and metal trace 122-2 by way of a parasitic capacitor 140.

As a result, a second parasitic signal path exists from metal bond pad 120-1 and metal trace 122-1 to metal bond pad 120-2 and metal trace 122-2 by way of capacitor 130, resistance 138, and capacitor 140 that can significantly attenuate the RF signal. Further, an RF signal capacitively coupled to metal bond pad 120-2 and metal trace 122-2 by way of parasitic capacitor 140 degrades and interferes with an RF signal that is placed on metal bond pad 120-2 and metal trace 122-2.

One approach to reducing the attenuation associated with the parasitic signal paths is to increase the thickness (height) of non-conductive material 114 so that metal bond pad 120-1 and metal trace 122-1 lie further away from the top surface of substrate material 110. Another approach is to reduce the coupling area by reducing the widths of the metal traces. A further approach is to utilize a high-resistance substrate material that has the effect of substantially increasing the values of resistance 134 and resistance 138.

Although each of these approaches provides some reduction in the attenuation of an RF signal, there is a need for an additional approach to reducing the attenuation of an RF signal that propagates down a metal trace of a metal interconnect structure after being applied to a metal bond pad.

BRIEF DESCRIPTION OF THE DRAWINGS

FIGS. 2A-2B are views illustrating an example of a semiconductor die 200 in accordance with the present invention.

FIGS. 3A-3B are views illustrating an example of a semiconductor die 300 in accordance with the present invention. FIG. 3A is a plan view, while

FIGS. 4A-4B are views illustrating an example of a semiconductor die 400 in accordance with the present invention.

FIGS. 5A-5B are views illustrating an example of a semiconductor die 500 in accordance with the present invention.

FIGS. 6A-6B are views illustrating an example of a semiconductor die 600 in accordance with the present invention.

FIGS. 7A-7B are views illustrating an example of a semiconductor die 700 in accordance with the present invention.

FIGS. 8A-8B are views illustrating a further example of the semiconductor dice 200-700 in accordance with the present invention.

FIGS. 9A-9B are views illustrating an additional example of the semiconductor dice 200-700 in accordance with the present invention.

DETAILED DESCRIPTION OF THE INVENTION

Figure 2A:
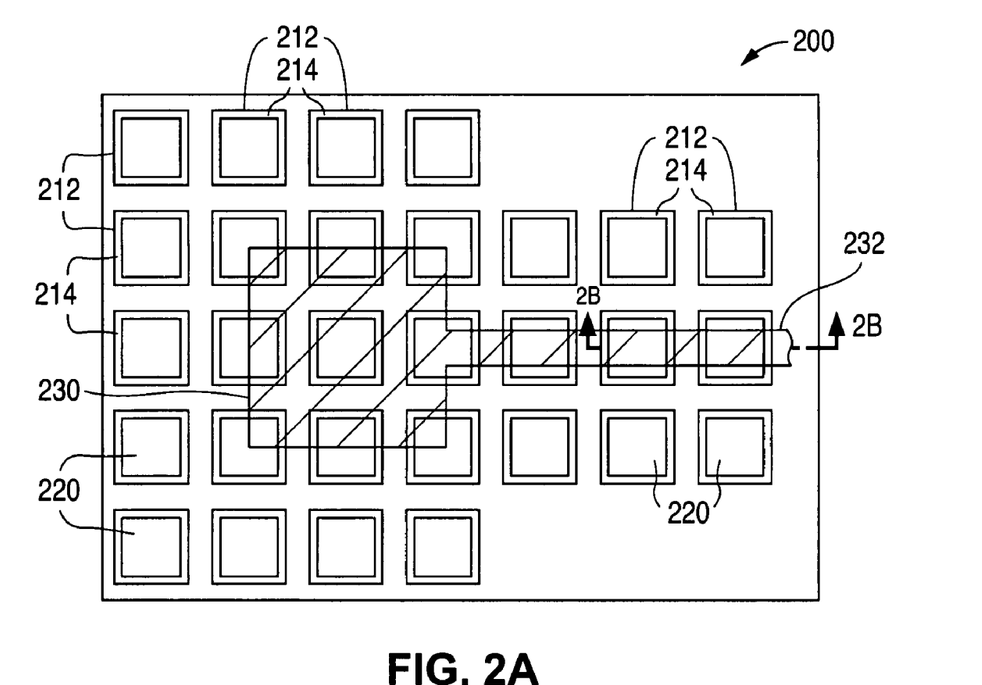
FIG. 2A is a plan view.
Figure 2B:
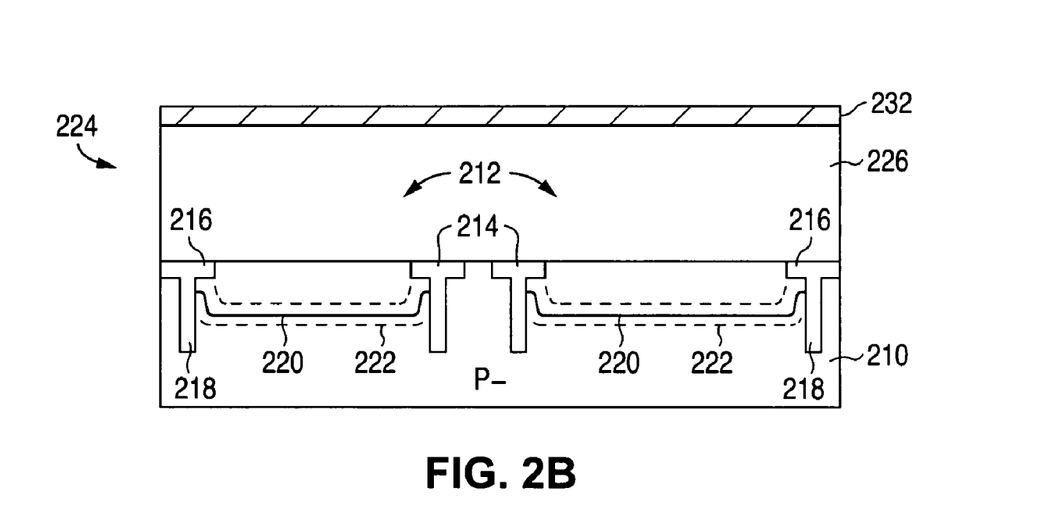
FIG. 2B is a cross-sectional view taken along lines 2B-2B of FIG. 2A.

FIGS. 2A-2B are views that illustrate an example of a semiconductor die 200 in accordance with the present invention. FIG. 2A shows a plan view, while FIG. 2B shows a cross-sectional view taken along lines 2B-2B of FIG. 2A. As described in greater detail below, semiconductor die 200 includes a number of RF blocking structures that reduce the attenuation of an RF signal.

As shown in FIGS. 2A-2B, semiconductor die 200 includes a p−substrate material 210, such as p− single-crystal silicon or a p− epitaxial layer, and a number of spaced-apart RF blocking structures 212 that are formed in substrate material 210. The RF blocking structures 212, in turn, include a number of isolation rings 214 such that each RF blocking structure 212 has an isolation ring 214. In addition, each isolation ring 214 includes a shallow trench isolation ring 216 and a deep trench isolation ring 218.

The RF blocking structures 212 also include a number of floating n− wells 220 that are formed in p− substrate material 210 such that each RF blocking structure has a floating n− well 220. A floating n− well 220 is defined to be an n− well that receives no external bias voltage. In the present example, the floating n− wells 220 do not touch any metal contact structures and, therefore, are never externally biased. Further, the n− wells 220 are formed in p− substrate material 210 such that each isolation ring 214 laterally surrounds an n− well 220. In the present example, no p-type region is formed in any n− well 220.

As further shown in FIGS. 2A-2B, the RF blocking structures 212 include a number of space-charge depletion regions 222 such that each RF blocking structure 212 includes a space-charge depletion region 222. The space-charge depletion region 222 of an RF blocking structure 212 extends into p− substrate material 210 and the n− well 220 of the RF blocking structure 212.

Semiconductor die 200 additionally includes a metal interconnect structure 224 that sits on the top surface of p− substrate material 210. Metal interconnect structure 224, in turn, includes a non-conductive structure 226 (which can include a number of separate non-conductive layers of the same or different materials), and a number of layers of metal, including a top layer of metal, that are isolated by non-conductive structure 226.

In the FIGS. 2A-2B example, only the top layer of metal is shown. In this example, the top layer of metal has a number of metal bond pads, including metal bond pad 230, and a number of metal traces, including metal trace 232, that extend away from the metal bond pads. Each metal bond pad provides a point for an external electrical connection, while each metal trace provides a signal path. Although not shown, the metal traces are electrically connected to devices that are formed in and on substrate material 210 and/or in the metal interconnect structure 224.

In operation, when an RF signal is applied to metal bond pad 230, the RF signal propagates down metal trace 232. As with semiconductor die 100, the RF signal on metal bond pad 230 and metal trace 232 of semiconductor die 200 is undesirably capacitively coupled to substrate material 210. In addition, the RF signal capacitively coupled to substrate material 210 is also resistively coupled to a substrate bias node and to other regions of substrate material 210.

In accordance with the present invention, by locating an array of RF blocking structures 212 directly below the metal bond pads 230 and the metal traces 232, the attenuation of the RF signal is reduced. Simulation results indicate an improvement of approximately 0.5 dB. In addition to the metal bond pads 230 and the metal traces 232, the RF blocking structures 212 can also be located directly below other devices that the RF signal passes through, such as an inductor and a capacitor of a passive equalizer that are formed in metal interconnect structure 224.

It is believed that the reduced attenuation results from the disruption of magnetically-induced eddy currents along the top surface of substrate material 210. For example, the isolation rings 214 block large eddy currents from forming along the top surface of substrate material 210, while the space-charge depletion regions 222 further reduce the formation of eddy currents.

Figure 3A:
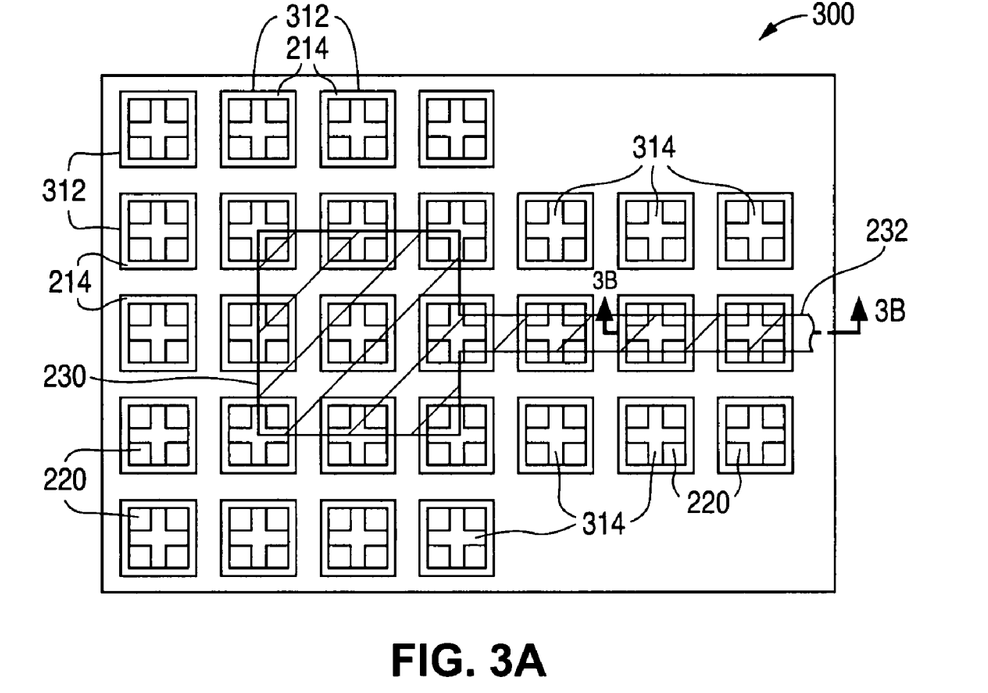
Figure 3B:
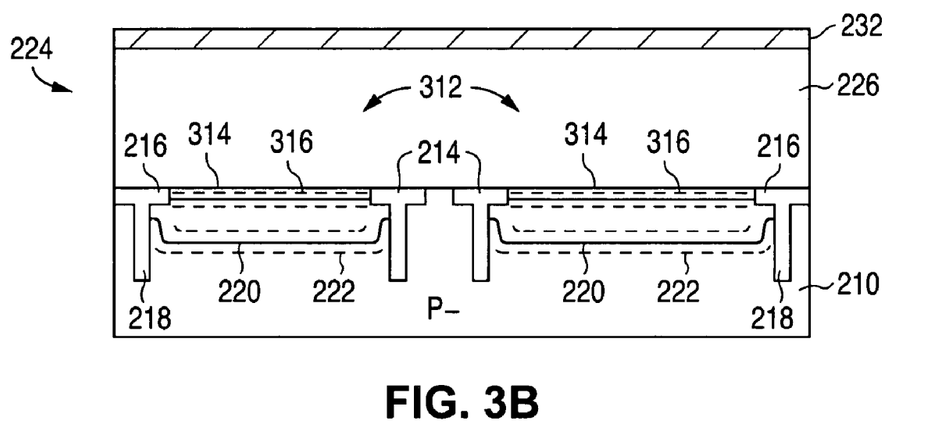
FIG. 3B is a cross-sectional view taken along lines 3B-3B of FIG. 3A.

FIGS. 3A-3B are views that illustrate an example of a semiconductor die 300 in accordance with the present invention. FIG. 3A shows a plan view, while FIG. 3B shows a cross-sectional view taken along lines 3B-3B of FIG. 3A. Semiconductor die 300 is similar to semiconductor die 200 and, as a result, utilizes the same reference numerals to designate the structures which are common to both dice.

As shown in FIGS. 3A-3B, semiconductor die 300 differs from semiconductor die 200 in that die 300 utilizes a number of RF blocking structures 312 in lieu of the RF blocking structures 212. The RF blocking structures 312, in turn, are similar to the RF blocking structures 212 and, as a result, utilize the same reference numerals to designate the elements which are common to both structures.

As further shown in FIGS. 3A-3B, the RF blocking structures 312 differ from the RF blocking structures 212 in that each RF blocking structure 312 also includes a floating p-type grid 314 that is formed in n-well 220, and a space-charge depletion region 316 that extends into n− well 220 and p-type grid 314. A floating p-type grid 314 is defined to be a p-type grid that receives no external bias voltage. In the present example, no floating p-type grid 314 touches any metal contact structure and, therefore, is never externally biased.

Each grid 314 is illustrated with a "+" shape that separates n− well 220 into four equally-sized cells for the sake of clarity, and can include a larger grid with additional cells of the same or different sizes. Further, a p-type grid 314 can have the same dopant concentration as substrate material 210, or a different, e.g., greater, dopant concentration than substrate material 210.

In operation, the presence of a p-type grid 314 in each RF blocking structure 312 limits the formation of any eddy currents that are larger than a grid cell, and allows the formation of a space-charge depletion region 316 in each RF blocking structure 312 that is in addition to space-charge depletion region 222. As a result, the combination of space-charge depletion region 222 and space-charge depletion region 316 in each RF blocking structure 312 further inhibits the formation of eddy currents.

Figure 4A:
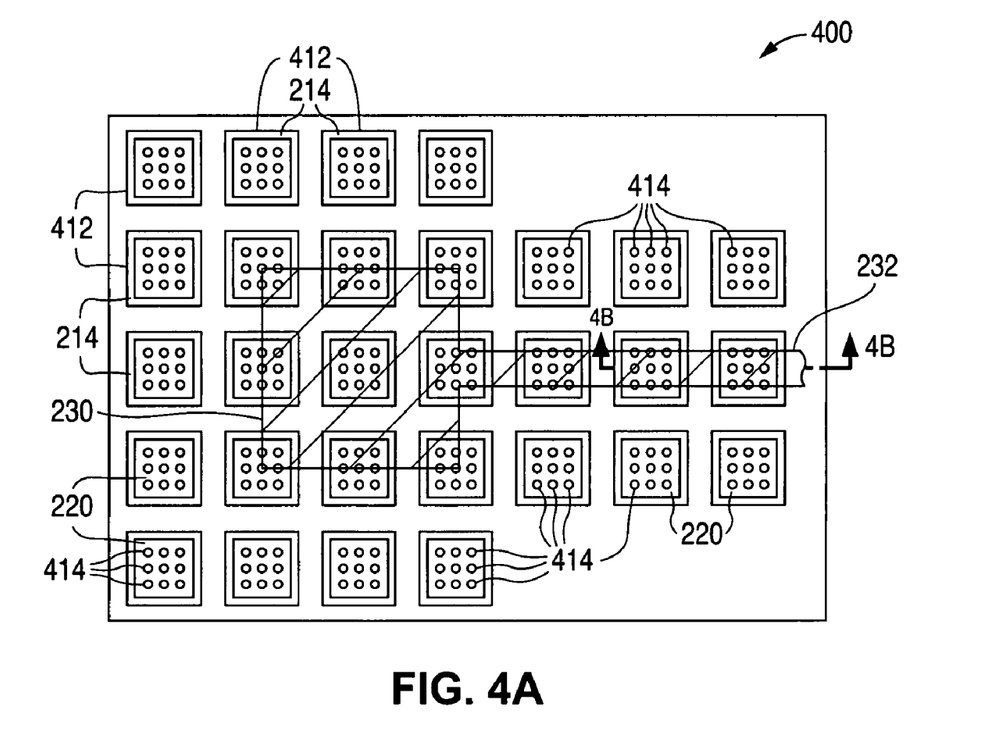
FIG. 4A is a plan view.
Figure 4B:
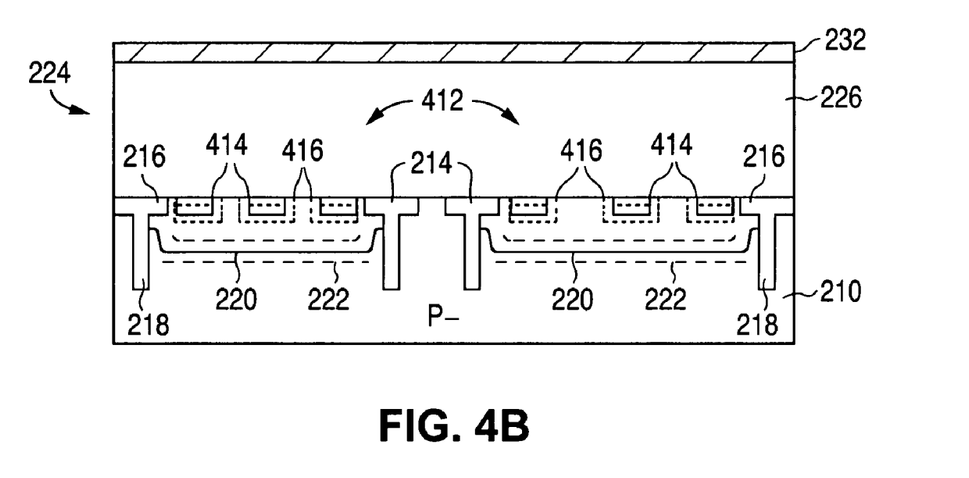
FIG. 4B is a cross-sectional view taken along lines 4B-4B of FIG. 4A.

FIGS. 4A-4B are views that illustrate an example of a semiconductor die 400 in accordance with the present invention. FIG. 4A shows a plan view, while FIG. 4B shows a cross-sectional view taken along lines 4B-4B of FIG. 4A. Semiconductor die 400 is similar to semiconductor die 200 and, as a result, utilizes the same reference numerals to designate the structures which are common to both dice.

As shown in FIGS. 4A-4B, semiconductor die 400 differs from semiconductor die 200 in that die 400 utilizes a number of RF blocking structures 412 in lieu of the RF blocking structures 212. The RF blocking structures 412, in turn, are similar to the RF blocking structures 212 and, as a result, utilize the same reference numerals to designate the elements which are common to both structures.

As further shown in FIGS. 4A-4B, the RF blocking structures 412 differ from the RF blocking structures 212 in that each RF blocking structure 412 also includes a number of spaced-apart floating p-type regions 414 that are formed in n− well 220, and a number of space-charge depletion regions 416 that extend into n− well 220 and the p-type regions 414. A floating p-type region 414 is defined to be a p-type region that receives no external bias. In the present example, the floating p-type regions 414 do not touch any metal contact structure and, therefore, are never externally biased. Further, a p-type region 414 can have the same dopant concentration as substrate material 210, or a different, e.g., greater, dopant concentration than substrate material 210.

In operation, the presence of the p-type regions 414 in each RF blocking structure 412 allows the formation of the space-charge depletion regions 416 in each RF blocking structure 412 that are in addition to space-charge depletion region 222. As a result, the combination of space-charge depletion region 222 and the space-charge depletion regions 416 in each RF blocking structure 412 further inhibits the formation of eddy currents.

Figure 5A:
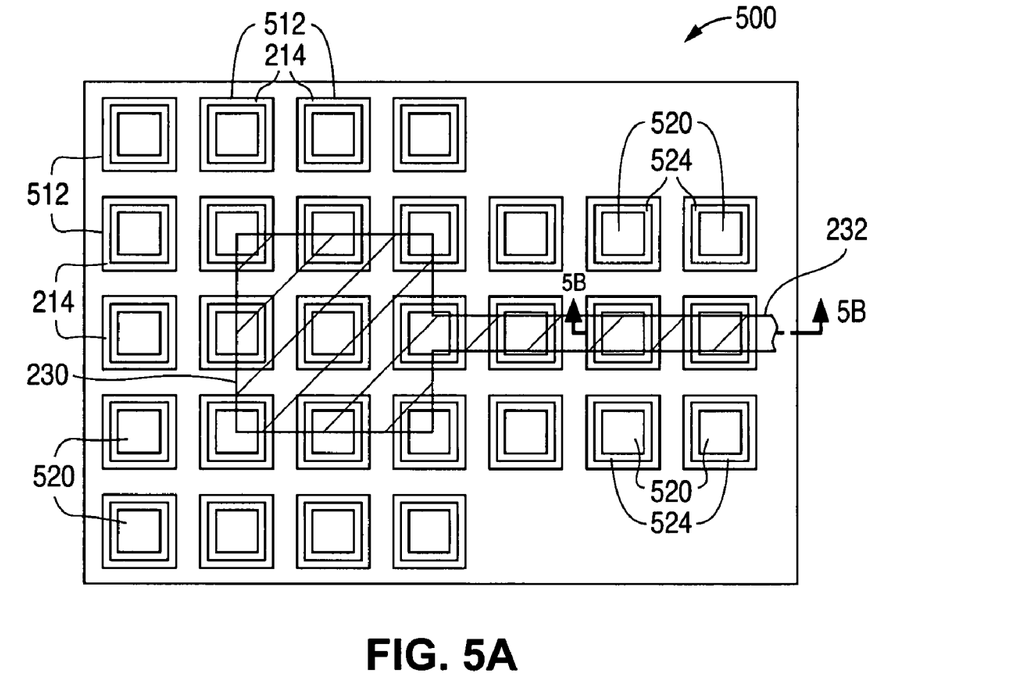
FIG. 5A is a plan view.
Figure 5B:
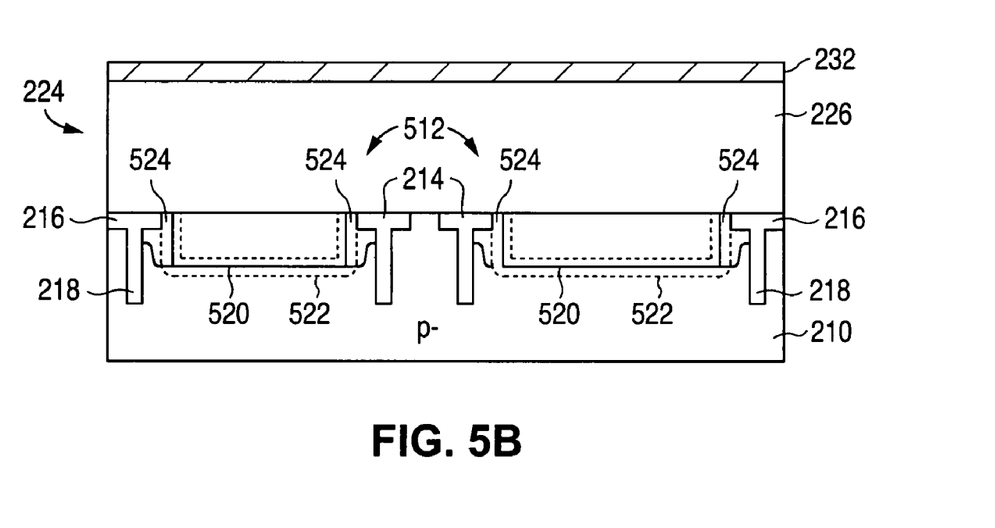
FIG. 5B is a cross-sectional view taken along lines 5B-5B of FIG. 5A.

FIGS. 5A-5B are views that illustrate an example of a semiconductor die 500 in accordance with the present invention. FIG. 5A shows a plan view, while FIG. 5B shows a cross-sectional view taken along lines 5B-5B of FIG. 5A. Semiconductor die 500 is similar to semiconductor die 200 and, as a result, utilizes the same reference numerals to designate the structures which are common to both die.

As shown in FIGS. 5A-5B, semiconductor die 500 differs from semiconductor die 200 in that die 500 utilizes a number of RF blocking structures 512 in lieu of the RF blocking structures 212. The RF blocking structures 512, in turn, are similar to the RF blocking structures 212 and, as a result, utilize the same reference numerals to designate the elements which are common to both structures.

As further shown in FIGS. 5A-5B, the RF blocking structures 512 differ from the RF blocking structures 212 in that each RF blocking structure 512 utilizes a floating n– well 520 in lieu of floating n– well 220, a space-charge depletion region 522 in lieu of space-charge depletion region 222, and a p-type ring 524 that lies between n– well 520 and isolation ring 214. A floating n– well 520 is defined to be an n– well that receives no external bias. In the present example, the floating n– wells 520 do not touch any metal contact structure and, therefore, are never externally biased. In addition, no p-type region is formed in any n– well 520. A p-type ring 524 can have the same dopant concentration as substrate material 210, or a different, e.g., greater, dopant concentration than substrate material 210.

In operation, the presence of a p-type ring 524 in each RF blocking structure 512 allows the formation of a space-charge depletion region 522 in each RF blocking structure 512 that is larger than a space-charge region 222. As a result, the larger space-charge depletion region 522 in each RF blocking structure 512 further inhibits the formation of eddy currents.

Figure 6A:
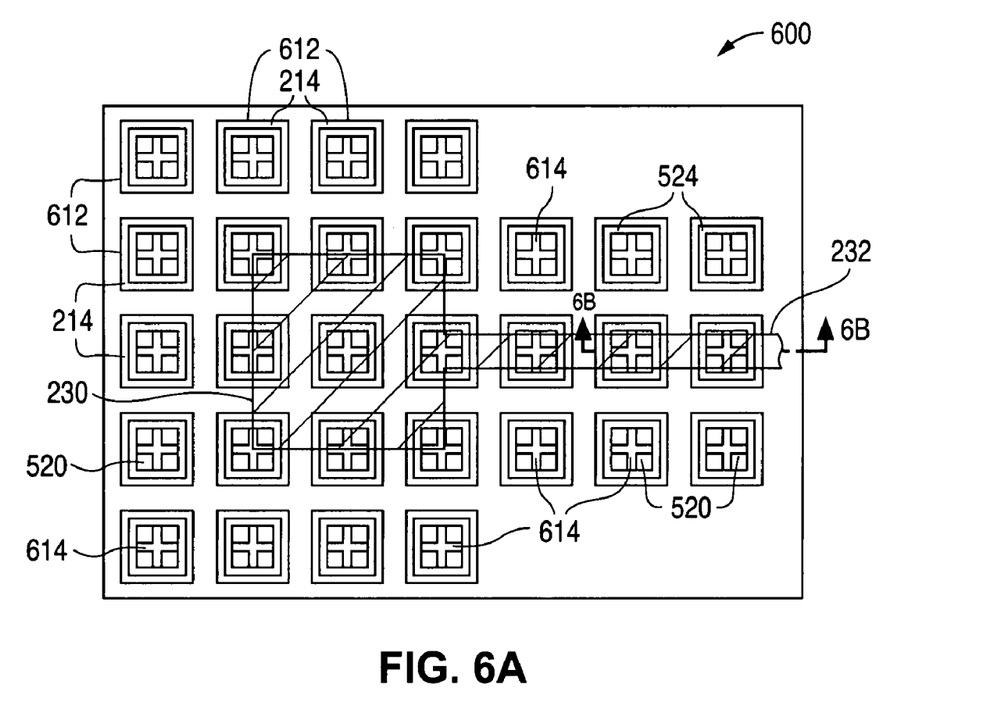
FIG. 6A is a plan view.
Figure 6B:
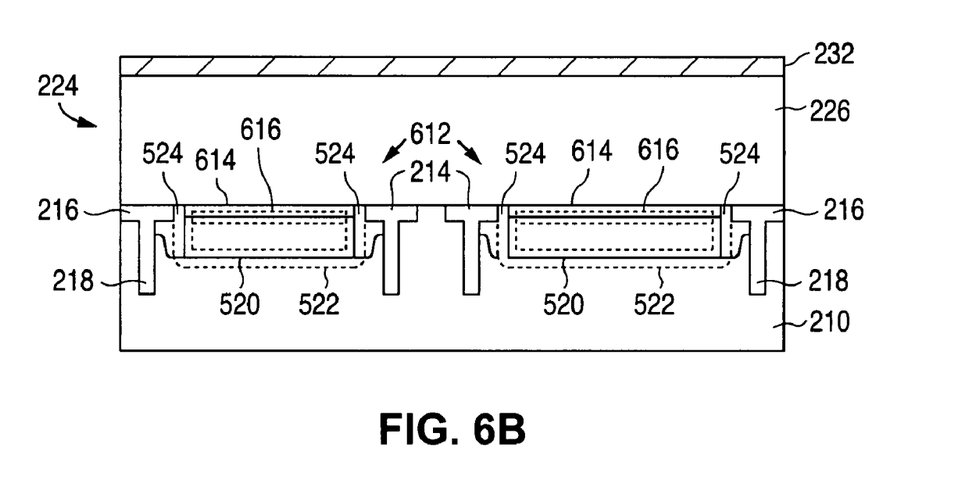
FIG. 6B is a cross-sectional view taken along lines 6B-6B of FIG. 6A.

FIGS. 6A-6B are views that illustrate an example of a semiconductor die 600 in accordance with the present invention. FIG. 6A shows a plan view, while FIG. 6B shows a cross-sectional view taken along lines 6B-6B of FIG. 6A. Semiconductor die 600 is similar to semiconductor die 500 and, as a result, utilizes the same reference numerals to designate the structures which are common to both dice.

As shown in FIGS. 6A-6B, semiconductor die 600 differs from semiconductor die 500 in that die 600 utilizes a number of RF blocking structures 612 in lieu of the RF blocking structures 512. The RF blocking structures 612, in turn, are similar to the RF blocking structures 512 and, as a result, utilize the same reference numerals to designate the elements which are common to both structures.

As further shown in FIGS. 6A-6B, the RF blocking structures 612 differ from the RF blocking structures 512 in that each RF blocking structure 612 also includes a floating p-type grid 614 that is formed in n–well 520, and a space-charge depletion region 616 that extends into n– well 520 and p-type grid 614. A floating p-type grid 614 is defined to be a p-type grid that receives no external bias. In the present example, no floating p-type grid 614 touches any metal contact structure and, therefore, is never externally biased.

Each grid 614 is illustrated with a "+" shape that separates n– well 520 into four equally-sized cells for the sake of clarity, and can include a larger grid with additional cells of the same or different sizes. Further, a p-type grid 614 can have the same dopant concentration as substrate material 210, or a different, e.g., greater, dopant concentration than substrate material 210.

In operation, the presence of a p-type grid 614 in each RF blocking structure 612 limits the formation of any eddy currents that are larger than a grid cell, and allows the formation of a space-charge depletion region 616 in each RF blocking structure 612 that is in addition to space-charge depletion region 522. As a result, the combination of space-charge depletion region 522 and space-charge depletion region 616 in each RF blocking structure 612 further inhibits the formation of eddy currents.

Figure 7A:
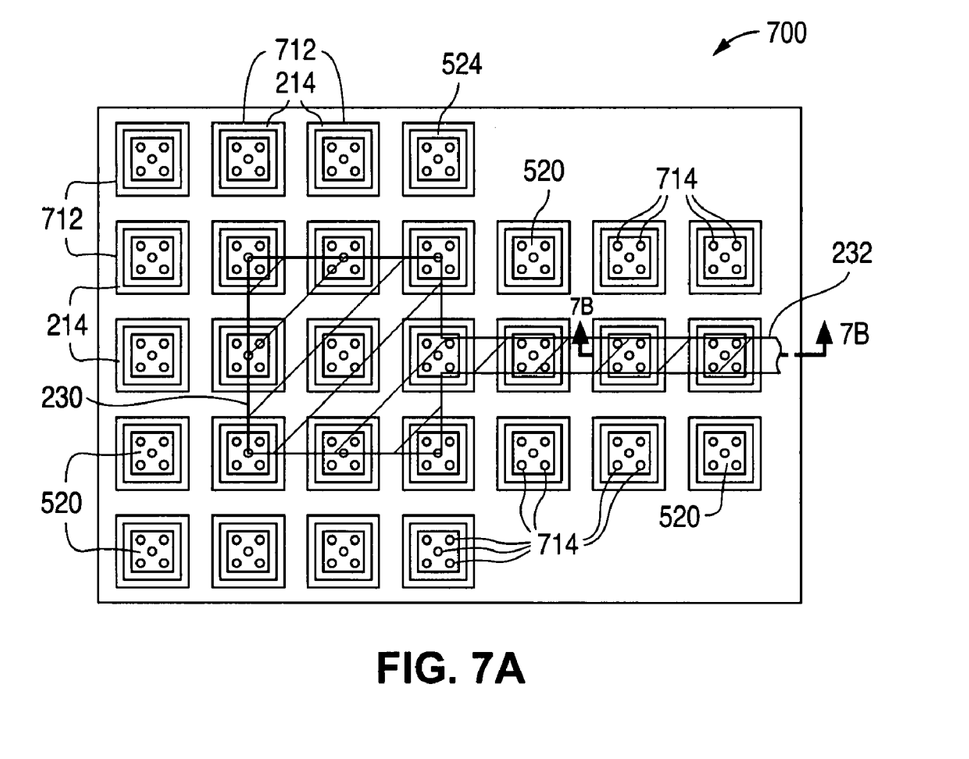
FIG. 7A is a plan view.
Figure 7B:
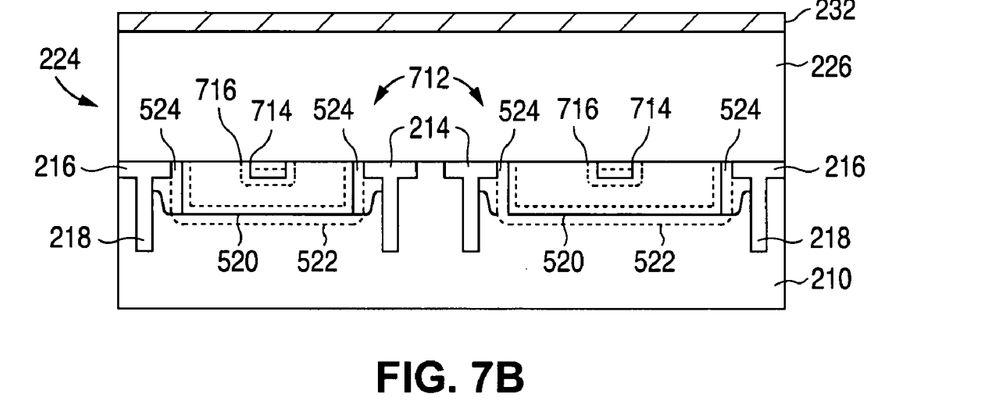
FIG. 7B is a cross-sectional view taken along lines 7B-7B of FIG. 7A.

FIGS. 7A-7B are views that illustrate an example of a semiconductor die 700 in accordance with the present invention. FIG. 7A shows a plan view, while FIG. 7B shows a cross-sectional view taken along lines 7B-7B of FIG. 7A. Semiconductor die 700 is similar to semiconductor die 500 and, as a result, utilizes the same reference numerals to designate the structures which are common to both dice.

As shown in FIGS. 7A-7B, semiconductor die 700 differs from semiconductor die 500 in that die 700 utilizes a number of RF blocking structures 712 in lieu of the RF blocking structures 512. The RF blocking structures 712, in turn, are similar to the RF blocking structures 512 and, as a result, utilize the same reference numerals to designate the elements which are common to both structures.

As further shown in FIGS. 7A-7B, the RF blocking structures 712 differ from the RF blocking structures 512 in that each RF blocking structure 712 also includes a number of spaced-apart floating p-type regions 714 that are formed in n– well 520, and a number of space-charge depletion regions 716 that extend into n– well 520 and the p-type regions 714. A floating p-type region 714 is defined to be a p-type region that receives no external bias. In the present example, the floating p-type regions 714 do not touch any metal contact structure and, therefore, are never externally biased. Further, a p-type region 714 can have the same dopant concentration as substrate material 210, or a different, e.g., greater, dopant concentration than substrate material 210.

In operation, the presence of the p-type regions 714 in each RF blocking structure 712 allows the formation of the space-charge depletion regions 716 in each RF blocking structure 712 that are in addition to space-charge depletion region 522. As a result, the combination of space-charge depletion region 522 and the space-charge depletion regions 716 in each RF blocking structure 712 further inhibits the formation of eddy currents.

Figure 8A:
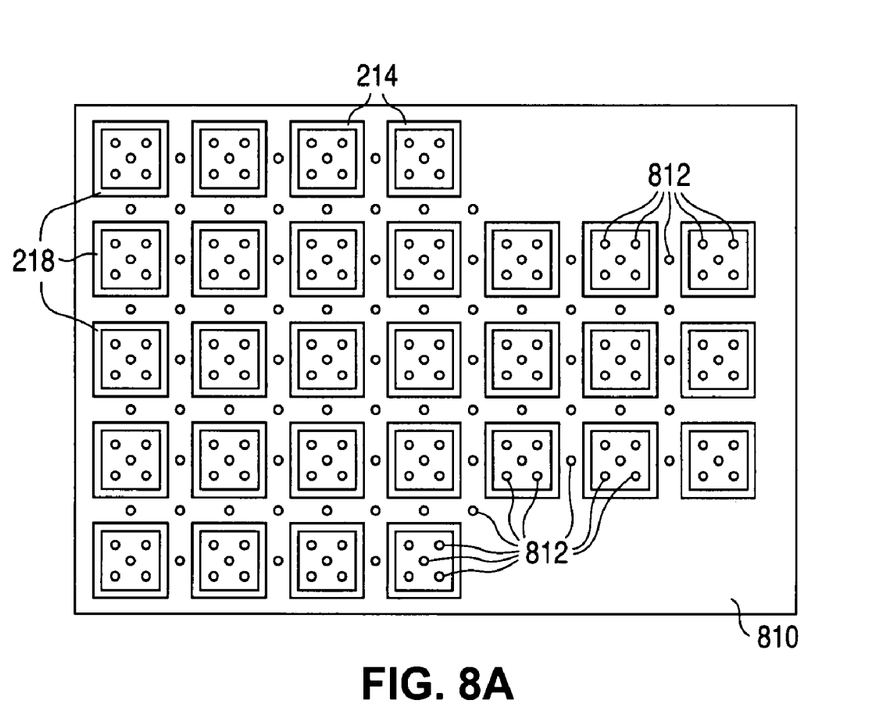
FIG. 8A is a plan view taken along lines 8A-8B of FIG. 8B.
Figure 8B:
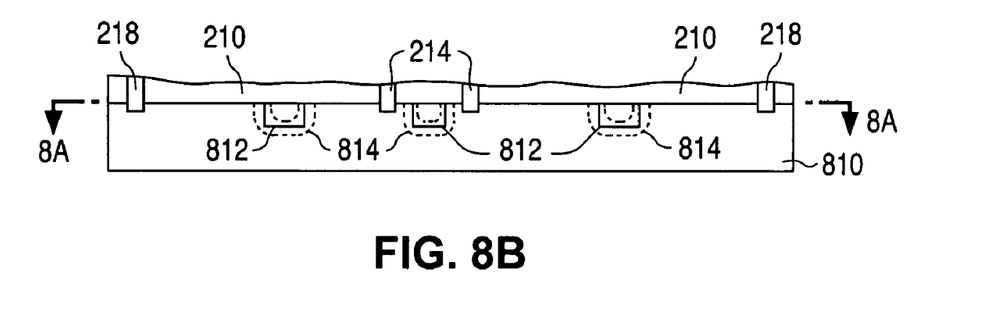
FIG. 8B is a cross-sectional view.

FIGS. 8A-8B are views that illustrate a further example of the semiconductor dice 200-700 in accordance with the present invention. FIG. 8B shows a cross-sectional view. FIG. 8A shows a plan view taken along lines 8A-8B of FIG. 8B. In the present invention, the semiconductor dice 200-700 can be implemented with the conductivity types reversed, for example, utilizing an n– substrate material, p– wells, and n-type grids and spaced-apart regions.

As shown in FIGS. 8A-8B, the semiconductor dice 200-700 can each have a p– substrate 810, such as single-crystal silicon, that contacts and lies below n– substrate material 210, and a number of spaced-apart n+ buried regions 812 that are formed in p– substrate 810. The n+ buried regions 812 also contact n– substrate material 210. The semiconductor dice 200-700 can each also have a number of space-charge depletion regions 814 that extend into p– substrate 810 and the n+ buried regions 812.

In operation, the presence of the n+ buried regions 812 below the isolation rings 214 allows the formation of the space-charge depletion regions 814 that are in addition to the previously discussed space-charge depletion regions of the dice 200-700. As a result, the addition of the space-charge depletion regions 814 to the previously-described space-charge depletion regions of the dice 200-700 further inhibits the formation of eddy currents.

Figure 9A:
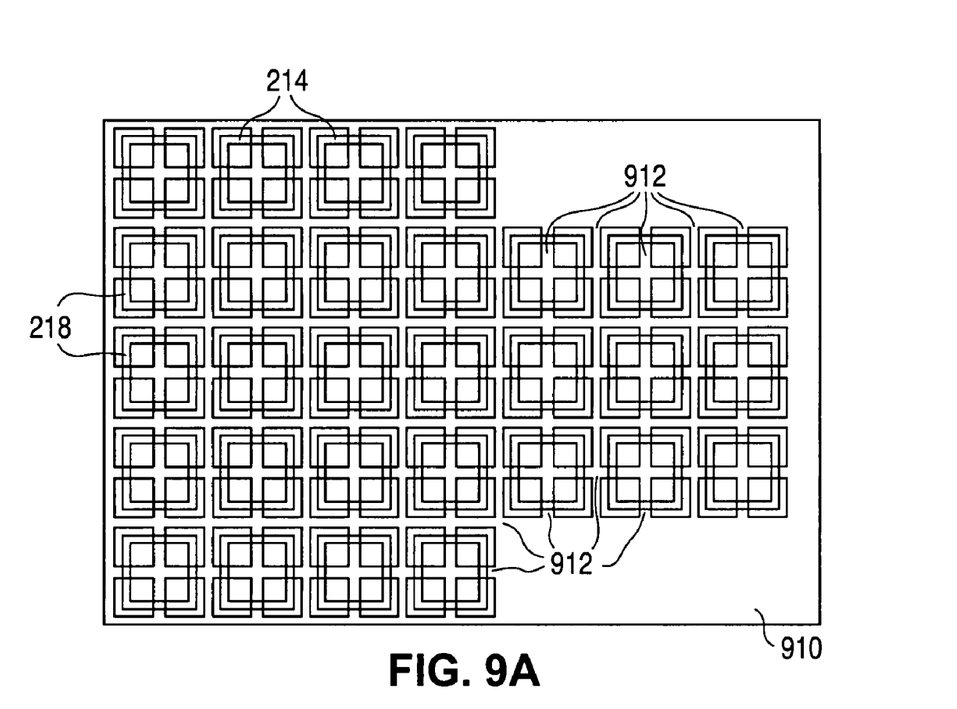
FIG. 9A is a plan view taken along lines 9A-9B of FIG. 9B.
Figure 9B:
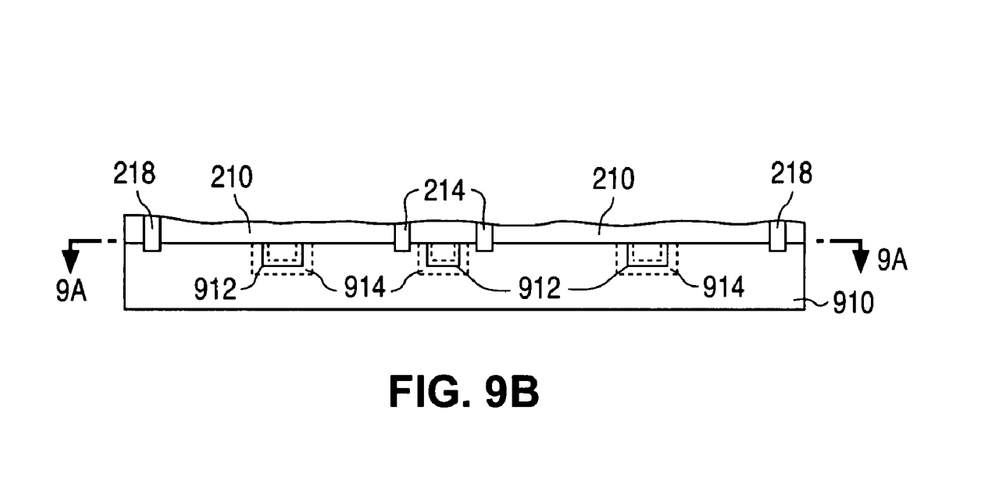
FIG. 9B is a cross-sectional view.

FIGS. 9A-9B are views that illustrate an additional example of the semiconductor dice 200-700 in accordance with the present invention. FIG. 9B shows a cross-sectional view. FIG. 9A shows a plan view taken along lines 9A-9B of FIG. 9B. As shown in FIGS. 9A-9B, the semiconductor dice 200-700 can each have a p– substrate 910, such as single-crystal silicon, that contacts and lies below n– substrate material 210, and an n+ grid 912 that is formed in p– substrate 910. N+ grid 912 also contacts n– substrate material 210. The semiconductor dice 200-700 can each also have a space-charge depletion region 914 that extends into p– substrate 910 and n+ grid 912.

In operation, the presence of n+ grid 912 below the isolation rings 214 limits the formation of any eddy currents that are larger than a grid cell, and allows the formation of a space-charge depletion region 914 that is in addition to the previously discussed space-charge depletion regions of dice 200-700. As a result, the addition of space-charge depletion region 914 to the previously-discussed space-charge depletion regions of dice 200-700 further inhibits the formation of eddy currents.

Figure 10A:
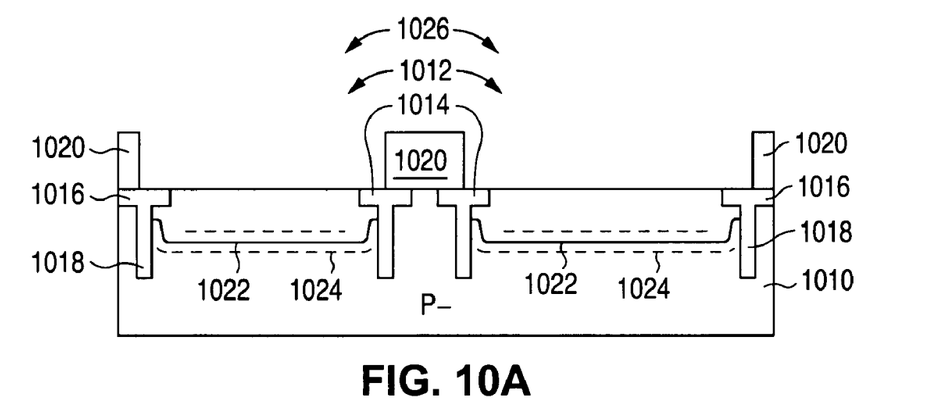
FIGS. 10A-10I are cross-sectional views illustrating an example of a method of forming a semiconductor die in accordance with the present invention.

FIGS. 10A-10I are cross-sectional views that illustrate an example of a method of forming a semiconductor die in accordance with the present invention. As shown in FIG. 10A, the method utilizes a conventionally-formed wafer that includes a p– substrate material 1010, such as p– single-crystal silicon or a p– epitaxial layer, and a number of spaced-apart dummy composite structures 1012 that are formed in substrate material 1010.

As further shown in FIG. 10A, the dummy composite structures 1012 include a number of isolation rings 1014 such that each dummy composite structure 1012 has an isolation ring 1014. In addition, each isolation ring 1014 includes a shallow trench isolation ring 1016 and a deep trench isolation ring 1018.

The wafer includes both active composite structures and dummy composite structures. Transistors and other devices are formed in the active composite structures of the wafer, while nothing is formed in the dummy composite structures. (In some prior-art fabrication processes, the dummy composite structures are implanted with a dopant (p-type in the present example) of the same conductivity type as the substrate material.)

Dummy composite structures are commonly formed in the inactive regions of a wafer, and serve to minimize dishing when the top surface of the substrate region is chemically-mechanically polished following the formation of the isolation rings 1014. In accordance with the present invention, an array of dummy composite structures 1012 are formed directly below where the RF metal bond pads, the RF metal traces, and the RF devices (e.g., the inductors) are to be formed.

Referring again to FIG. 10A, the method begins by forming and patterning a mask 1020 on the top surface of p– substrate material 1010. Following this, the wafer is implanted with an n-type dopant to form a number of n– wells 1022 such that an n– well 1022 lies inside the isolation ring 1014 of each dummy composite structure 1012.

In addition, a space-charge depletion region 1024 is formed along the junction between each n-well 1022 and the substrate material 1010. (A space-charge depletion region is formed whenever an n-type material is brought into contact with a p– type material.) As shown, the implant forms a number of RF blocking structures 1026, like RF blocking structures 212. Mask 1020 is then removed.

Figure 10B:
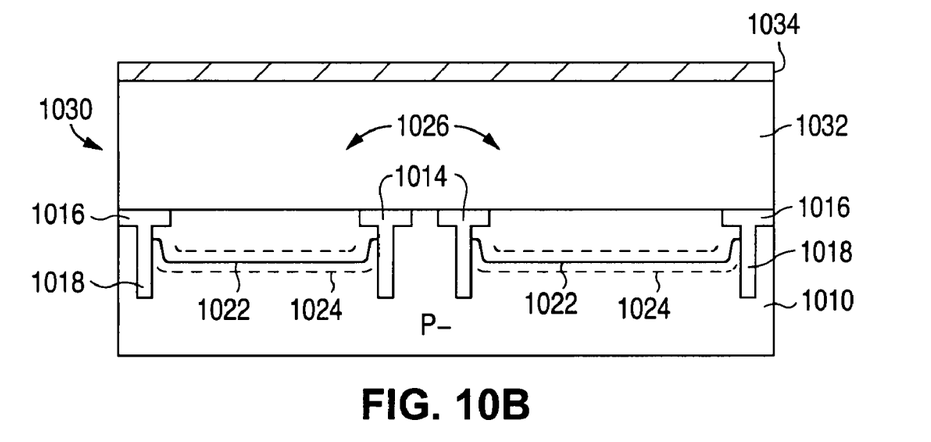

Next, as shown in FIG. 10B, a metal interconnect structure 1030 is conventionally formed on the top surface of p– substrate material 1010 so that no portion of the n– wells 1022 is electrically connected to metal interconnect structure 1030. Metal interconnect structure 1030 includes a non-conductive structure 1032, such as a number of layers of oxide and nitride, that touches the top surface of p– substrate material 1010, and a top metal layer that includes a metal structure 1034, such as a metal bond pad or a metal trace.

Figure 10C:
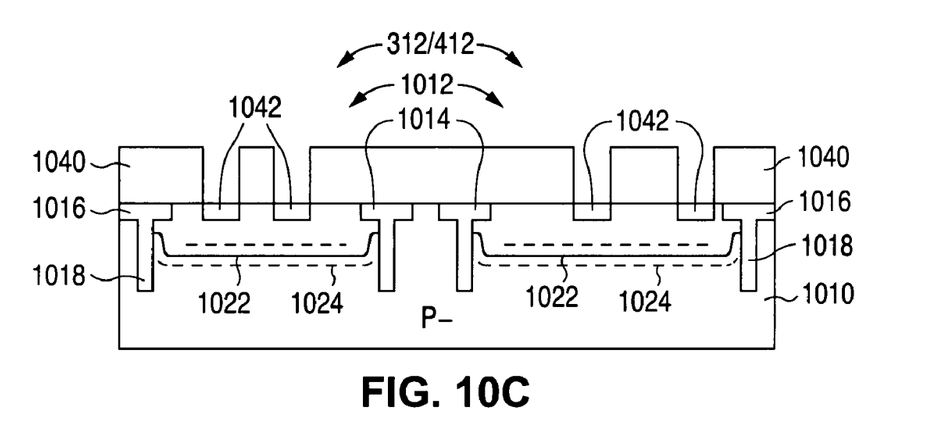

Alternately, as shown in FIG. 10C, after the n– wells 1022 have been formed and mask 1020 has been removed, a mask 1040 can be formed and patterned on the top surface of p– substrate material 1010. Following this, the wafer is implanted with a p-type dopant to form a number of p+ structures 1042 so that a p+ structure 1042 lies inside each n– well 1022. The p+ structures 1042 can be formed as a grid (to form a number of RF blocking structures 312) or as a number of spaced-apart regions (to form a number of RF blocking structures 412). Mask 1040 is then removed, followed by the conventional formation of metal interconnect structure 1030.

Figure 10D:
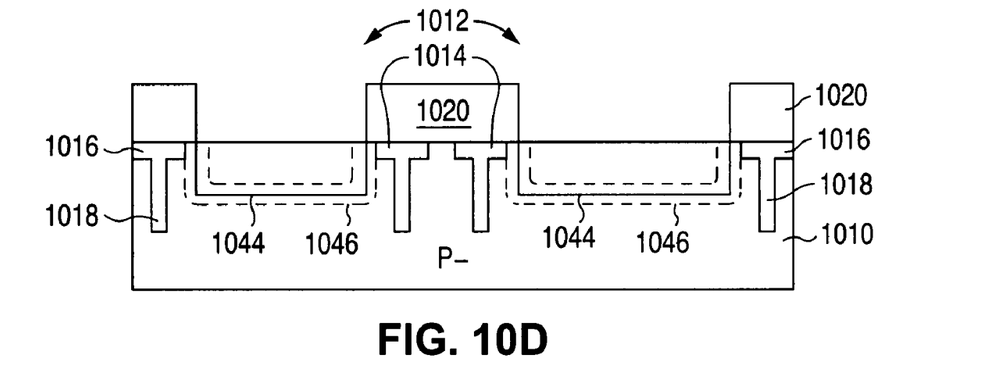

Alternately, rather than patterning mask 1020 as shown in FIG. 10A, mask 1020 can be patterned as shown in FIG. 10D to protect a peripheral region of each RF blocking structure. Following this, the wafer is implanted with an n-type dopant to form an n– well 1044 that lies inside the isolation ring 1014 of each dummy composite structure 1012. In addition, a space-charge depletion region 1046 is formed along the junction between each n– well 1044 and the substrate material 1010. (A space-charge depletion region is formed whenever an n-type material is brought into contact with a p– type material.)

Figure 10E:
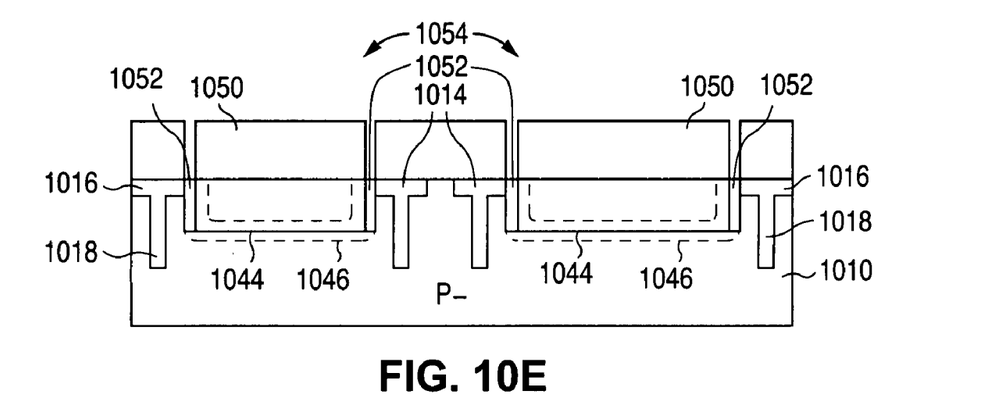

Next, as shown in FIG. 10E, after alternately patterned mask 1020 has been removed, a mask 1050 is formed and patterned on the top surface of substrate material 1010. Following this, the wafer is implanted with a p-type dopant to form a p-type ring 1052 that lies between each n– well 1044 and isolation ring 1014. As shown, the implant forms a number of RF blocking structures 1054, like RF blocking structures 512. Mask 1050 is then removed, followed by the conventional formation of metal interconnect structure 1030.

Figure 10F:
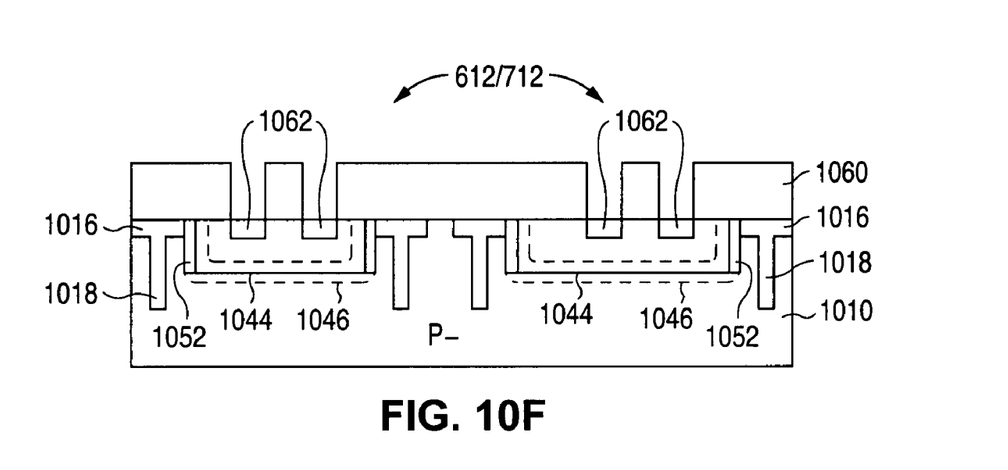

Alternately, as shown in FIG. 10F, after the p– type rings 1052 have been formed and mask 1050 has been removed, a mask 1060 can be formed and patterned on the top surface of p– substrate material 1010. Following this, the wafer is implanted with a p-type dopant to form a number of p+ structures 1062 so that a p+ structure 1062 lies inside each n– well 1044. The p+ structures 1062 can be formed as a grid (to form a number of RF blocking structures 612) or as a number of spaced-apart regions (to form a number of RF blocking structures 712). Mask 1060 is then removed, followed by the conventional formation of metal interconnect structure 1030.

Figure 10G:
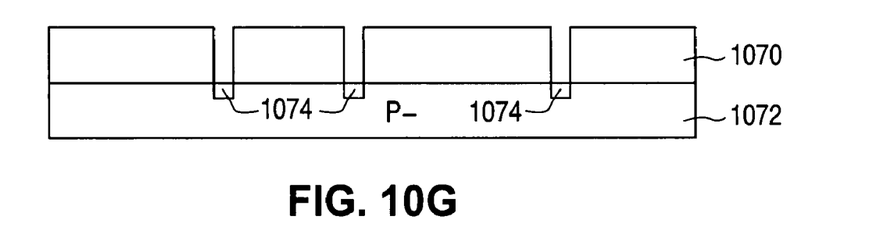

Alternately, as shown in FIG. 10G, prior to the formation of substrate material 1010, a mask 1070 can be formed on the top surface of a conventionally-formed p– wafer material 1072. Following this, the wafer material 1072 is implanted with an n-type dopant to form a number of n+ structures 1074 that lie directly below where a metal bond pad, metal trace, or other RF structure is to be formed. The n+ structures 1074 can be formed as a number of spaced-apart regions (to form spaced-apart regions 812), or as a grid (to form grid 912). Mask 1070 is then removed.

Figure 10H:
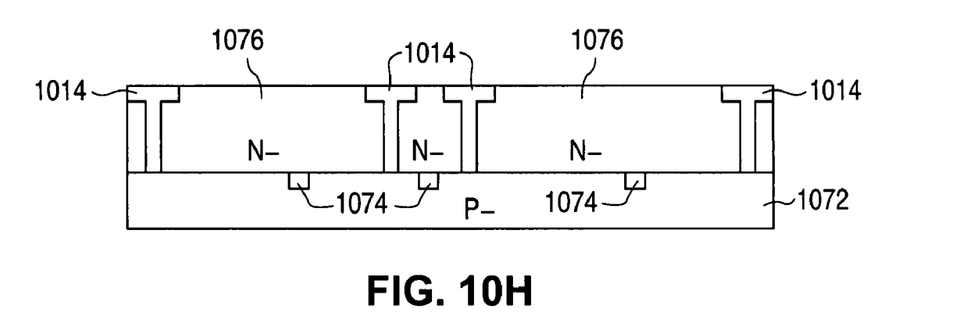
Figure 10I:
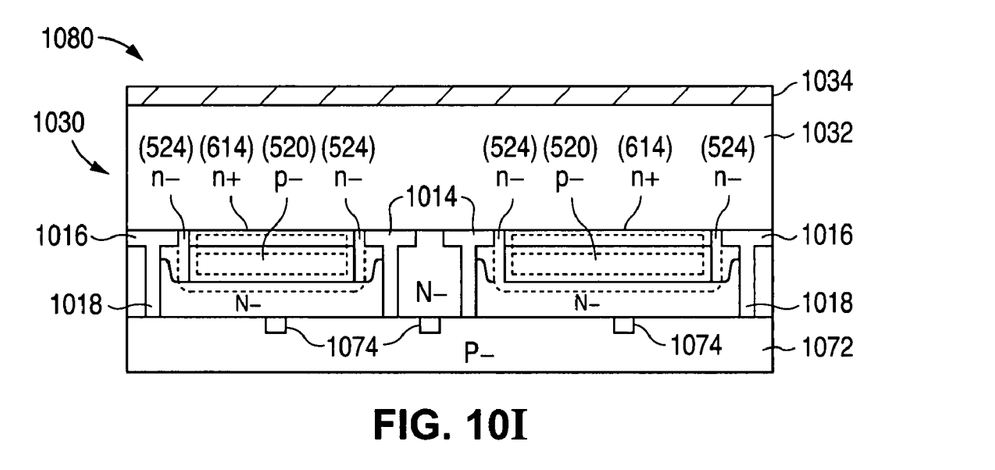

Next, as shown in FIG. 10H, an n− epitaxial layer 1076 is conventionally grown on the top surface of p− wafer material 1072 to form n− substrate material 1010, followed by the conventional formation of the isolation rings 1014. After this, the structures of semiconductor dice 200, 300, 400, 500, 600, or 700 are formed in epitaxial layer 1076 as discussed above, followed by the conventional formation of metal interconnect structure 1030 to form, when singulated, a die 1080. As shown in FIG. 10I, die 1080 is identical to die 600 except that the conductivity types are reversed.

It should be understood that the above descriptions are examples of the present invention, and that various alternatives of the invention described herein may be employed in practicing the invention. Thus, it is intended that the following claims define the scope of the invention and that structures and methods within the scope of these claims and their equivalents be covered thereby.

What is claimed is:

1. A semiconductor die comprising:
   a substrate material of a first conductivity type;
   a number of spaced-apart blocking structures, each blocking structure having:
      an isolation ring formed in the substrate material;
      a floating well of a second conductivity type formed in the substrate material, the isolation ring laterally surrounding the floating well; and
      a space-charge depletion region extending along a junction between the substrate material and the floating well;
   a semiconductor material of the second conductivity type, the semiconductor material having a top surface, the substrate material touching the top surface of the semiconductor material; and
   a plurality of spaced-apart regions of the first conductivity type formed in the semiconductor material.

2. A semiconductor die comprising:
   a substrate material of a first conductivity type;
   a number of spaced-apart blocking structures, each blocking structure having:
      an isolation ring formed in the substrate material;
      a floating well of a second conductivity type formed in the substrate material, the isolation ring laterally surrounding the floating well; and
      a space-charge depletion region extending along a junction between the substrate material and the floating well;
   a semiconductor material of the second conductivity type, the semiconductor material having a top surface, the substrate material touching the top surface of the semiconductor material; and
   a grid of the first conductivity type formed in the semiconductor material.

3. A semiconductor die comprising:
   a first semiconductor region of a first conductivity type; and
   a second semiconductor region of a second conductivity type that touches the first semiconductor region, the first semiconductor region laterally surrounding the second semiconductor region, the second semiconductor region electrically floating, no portion of the second semiconductor region lying directly vertically below a region of the first conductivity type that is both connected to receive a substantially constant voltage and spaced apart from the first semiconductor region.

4. The semiconductor die of claim 3 wherein no portion of the second semiconductor region lies directly vertically below and spaced apart from a region of the second conductivity type that is both connected to receive a substantially constant voltage and spaced apart from the first semiconductor region.

5. The semiconductor die of claim 3 wherein no region of the first conductivity type both touches the second semiconductor region and lies spaced apart from the first semiconductor region.

6. The semiconductor die of claim 3 and further comprising a third semiconductor region of the first conductivity type that touches the second semiconductor region and lies spaced apart from the first semiconductor region, the third semiconductor region electrically floating.

7. The semiconductor die of claim 3 and further comprising a third semiconductor region of the first conductivity type that touches the first and second semiconductor regions, the third semiconductor region lying directly vertically over a portion of the second semiconductor region.

8. The semiconductor die of claim 3 and further comprising a non-conductive structure that touches the first and second semiconductor regions, the non-conductive structure laterally surrounding the second semiconductor region.

9. The semiconductor die of claim 3 and further comprising a non-conductive structure that touches the first semiconductor region and laterally surrounds the second semiconductor region, only a portion of the first semiconductor region lying laterally between the second semiconductor region and the non-conductive structure.

10. The semiconductor die of claim 5 and further comprising a non-conductive structure that touches the first and second semiconductor regions, the non-conductive structure laterally surrounding the second semiconductor region.

11. The semiconductor die of claim 5 and further comprising a non-conductive structure that touches the first semiconductor region and laterally surrounds the second semiconductor region, only a portion of the first semiconductor region lying laterally between the second semiconductor region and the non-conductive structure.

12. A semiconductor die comprising:
    a first semiconductor region of a first conductivity type;
    a plurality of second semiconductor regions of a second conductivity type that touch the first semiconductor region, the plurality of second semiconductor regions being spaced apart and arranged in rows and columns, each of the second semiconductor regions electrically floating, the first semiconductor region laterally surrounding the plurality of second semiconductor regions, no portion of a second semiconductor region of the plurality of second semiconductor regions lying directly vertically below a region of the first conductivity type that is both connected to receive a substantially constant voltage and spaced apart from the first semiconductor region.

13. The semiconductor die of claim 12 wherein no portion of a second semiconductor region of the plurality of second semiconductor regions lies directly vertically below and spaced apart from a region of the second conductivity type that is both connected to receive a substantially constant voltage and spaced apart from the first semiconductor region.

14. The semiconductor die of claim 12 wherein no region of the first conductivity type both touches a second semiconductor region of the plurality of second semiconductor regions and lies spaced apart from the first semiconductor region.

15. The semiconductor die of claim 12 and further comprising a plurality of third semiconductor regions of the first conductivity type that touch the plurality of second semiconductor regions and lie spaced apart from the first semiconductor region, each third semiconductor region electrically floating.

16. The semiconductor die of claim 12 and further comprising a plurality of third semiconductor regions of the first conductivity type that touch the first semiconductor region and the plurality of second semiconductor regions, each third semiconductor region lying directly vertically over a portion of a second semiconductor region.

17. The semiconductor die of claim 12 and further comprising:
- a third semiconductor region of the second conductivity type, the third semiconductor region having a top surface, the first semiconductor region touching the top surface of the third semiconductor region; and
- a fourth semiconductor region of the first conductivity type that touches the first and third semiconductor regions, the fourth semiconductor region lying directly vertically below each of the second semiconductor regions.

18. The semiconductor die of claim 12 and further comprising:
- a third semiconductor region of the second conductivity type, the third semiconductor region having a top surface, the first semiconductor region touching the top surface of the third semiconductor region; and
- a number of fourth semiconductor regions of the first conductivity type that touch the first and third semiconductor regions, each second semiconductor region lying directly vertically over a fourth semiconductor region.

19. The semiconductor die of claim 18 wherein a group of the number of fourth semiconductor regions lie below and between the second semiconductor regions.

20. The semiconductor die of claim 12 and further comprising a plurality of non-conductive structures that touch the first and second semiconductor regions, the plurality of isolation structures laterally surrounding the plurality of second semiconductor regions such that each second semiconductor region is laterally surrounded by a non-conductive structure.

21. The semiconductor die of claim 12 and further comprising a plurality of non-conductive structures that touch the first semiconductor region and laterally surround the plurality of second semiconductor regions such that each second semiconductor region is laterally surrounded by a non-conductive structure, only a portion of the first semiconductor region lying laterally between each second semiconductor region and a laterally-surrounding non-conductive structure.

22. The semiconductor die of claim 12 and further comprising:
- a non-conductive structure that touches each top surface of the plurality of second semiconductor regions, the non-conductive structure having a top surface; and
- a metal pad that touches the top surface of the non-conductive structure and lies directly vertically over a number of second semiconductor regions that lie in a plurality of rows and columns, the number of second semiconductor regions being less than all of the plurality of second semiconductor regions.

* * * * *